(12) United States Patent
Fuse et al.

(10) Patent No.: US 10,777,415 B2
(45) Date of Patent: Sep. 15, 2020

(54) HEAT TREATMENT METHOD FOR DOPANT INTRODUCTION

(71) Applicant: SCREEN HOLDINGS CO., LTD., Kyoto (JP)

(72) Inventors: Kazuhiko Fuse, Kyoto (JP); Hikaru Kawarazaki, Kyoto (JP); Hideaki Tanimura, Kyoto (JP); Shinichi Kato, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 87 days.

(21) Appl. No.: 16/232,698

(22) Filed: Dec. 26, 2018

(65) Prior Publication Data

US 2019/0244817 A1    Aug. 8, 2019

(30) Foreign Application Priority Data

Feb. 5, 2018  (JP) .................................. 2018-017853

(51) Int. Cl.
*H01L 21/228* (2006.01)
*H01L 21/324* (2006.01)
(Continued)

(52) U.S. Cl.
CPC ........ *H01L 21/228* (2013.01); *H01L 21/3003* (2013.01); *H01L 21/324* (2013.01);
(Continued)

(58) Field of Classification Search
CPC .................................................. H01L 21/324
See application file for complete search history.

(56) References Cited

U.S. PATENT DOCUMENTS 9,343,311 B2 *  5/2016  Kato .................. H01L 21/228
9,437,448 B2 *  9/2016  Kiyama ............ H01L 21/67028
(Continued)

FOREIGN PATENT DOCUMENTS

JP     2007-201337 A    8/2007
JP     2016-184670 A   10/2016
KR   10-2003-0089764 A  11/2003

OTHER PUBLICATIONS

Y. Shacham-Diamand et al., "The Effect of Hydrogen on Boron Diffusion in SiO2", Journal of Electronics Materials, vol. 15, Feb. 25, 1986, p. 229.

(Continued)

*Primary Examiner* — Yu-Hsi D Sun
(74) *Attorney, Agent, or Firm* — McDermott Will & Emery LLP

(57) ABSTRACT

Hydrogen annealing for heating a semiconductor wafer on which a thin film containing a dopant is deposited to an annealing temperature under an atmosphere containing hydrogen is performed. A native oxide film is inevitably formed between the thin film containing the dopant and the semiconductor wafer, however, by performing hydrogen annealing, the dopant atoms diffuse relatively easily in the native oxide film and accumulate at the interface between the front surface of the semiconductor wafer and the native oxide film. Subsequently, the semiconductor wafer is preheated to a preheating temperature under a nitrogen atmosphere, and then, flash heating treatment in which the front surface of the semiconductor wafer is heated to a peak temperature for less than one second is performed. The dopant atoms are diffused and activated in a shallow manner from the front surface of the semiconductor wafer, thus, the low-resistance and extremely shallow junction is obtained.

7 Claims, 12 Drawing Sheets

(51) Int. Cl.
    *H01L 21/67*       (2006.01)
    *H01L 21/30*       (2006.01)
    *H01L 21/477*     (2006.01)
    *H01L 21/687*     (2006.01)

(52) U.S. Cl.
    CPC ...... *H01L 21/477* (2013.01); *H01L 21/67115* (2013.01); *H01L 21/67248* (2013.01); *H01L 21/6875* (2013.01); *H01L 21/68707* (2013.01)

(56) References Cited

U.S. PATENT DOCUMENTS

| | | |
|---|---|---|
| 2003/0215991 A1 | 11/2003 | Sohn et al. |
| 2004/0018702 A1 | 1/2004 | Ito et al. |
| 2009/0035909 A1 | 2/2009 | Chang et al. |
| 2012/0003826 A1 | 1/2012 | Pollard et al. |
| 2015/0287591 A1* | 10/2015 | Pore ................. C23C 16/45531 438/778 |
| 2018/0076061 A1 | 3/2018 | Fuse |

OTHER PUBLICATIONS

Taiwanese Office Action issued in corresponding Taiwanese Patent Application No. 107142916, dated Oct. 24, 2019, with English translation of the Japanese translation of the Taiwanese Office Action.
Korean Office Action issued in corresponding Korean Patent Application No. 10-2018-0168428, dated Jun. 18, 2020, with English translation.
Taiwanese Office Action issued in corresponding Taiwanese Patent Application No. 107142916, dated Jun. 29, 2020, with English translation of the Japanese translation of the Taiwanese Office Action.

\* cited by examiner

F I G . 4
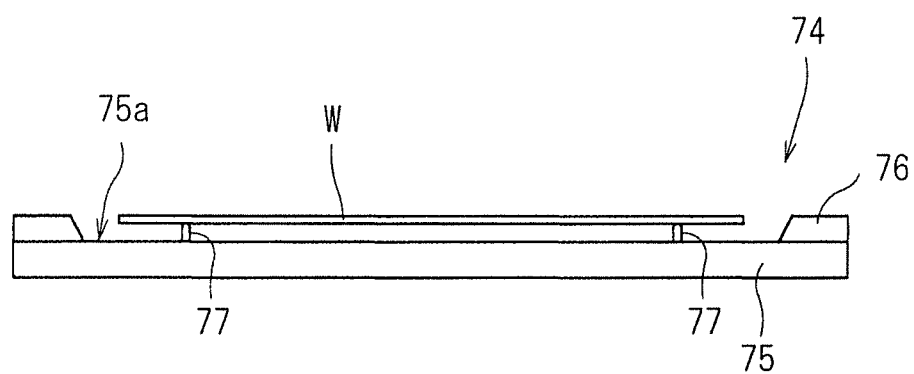

F I G. 5
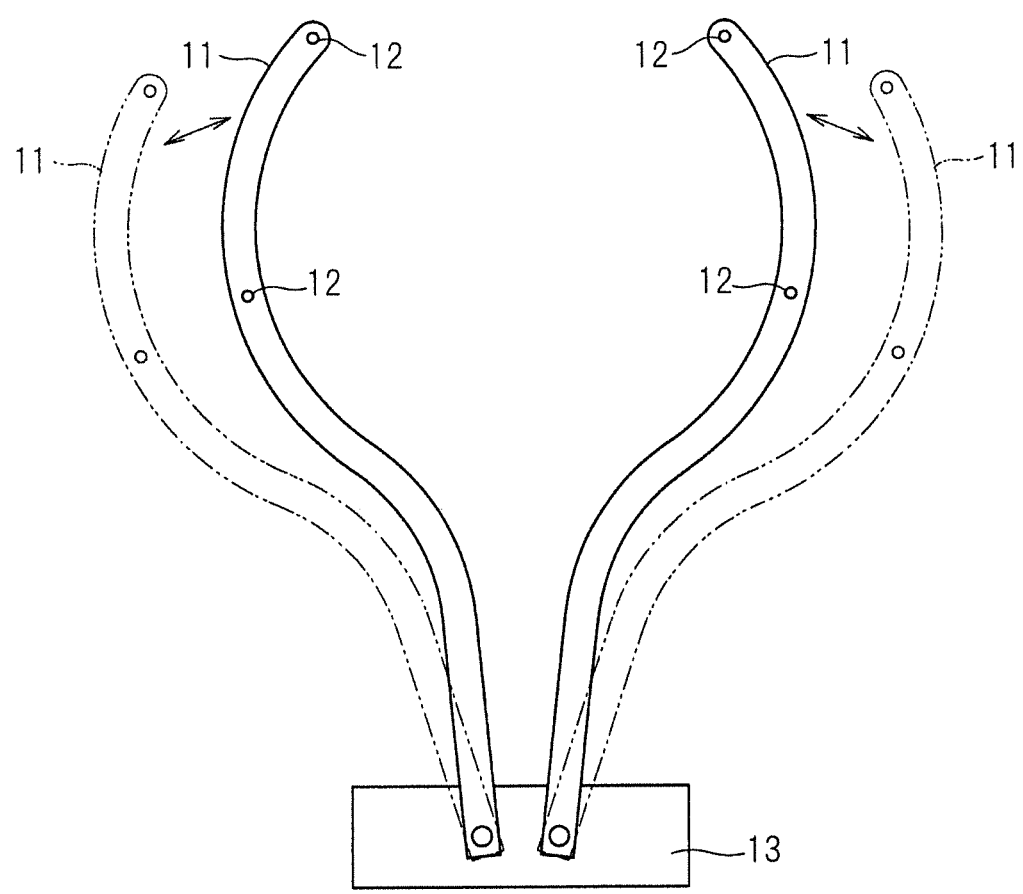

F I G . 7
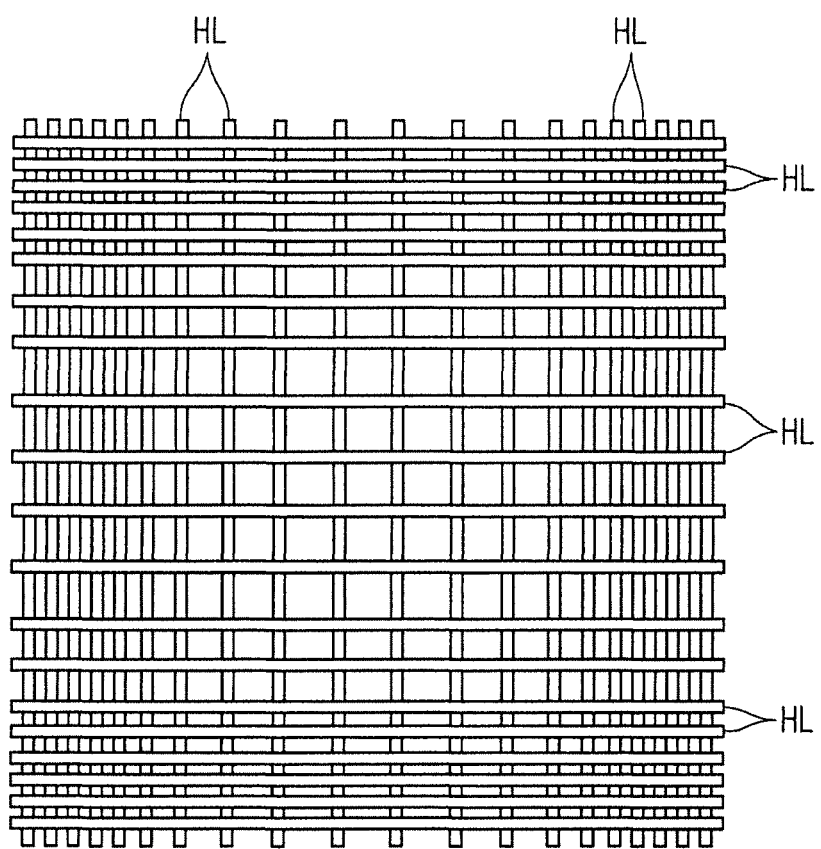

F I G . 1 0
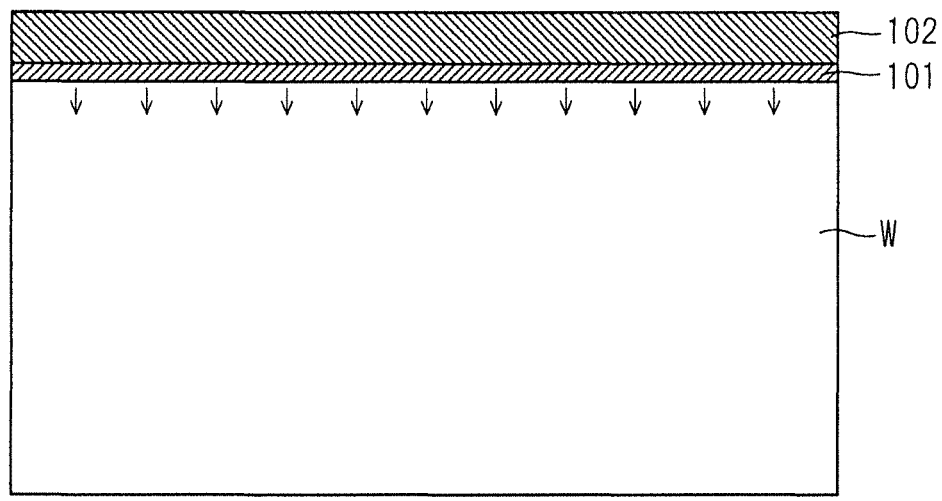

F I G. 1 1
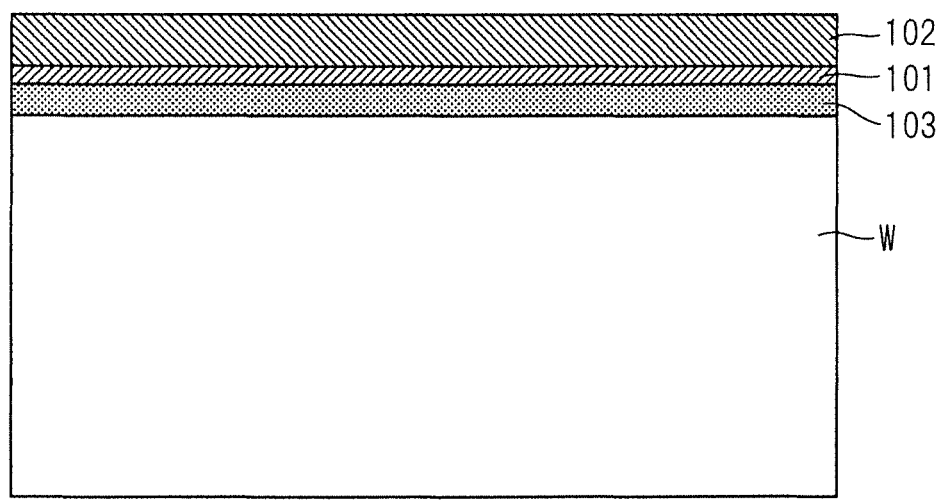

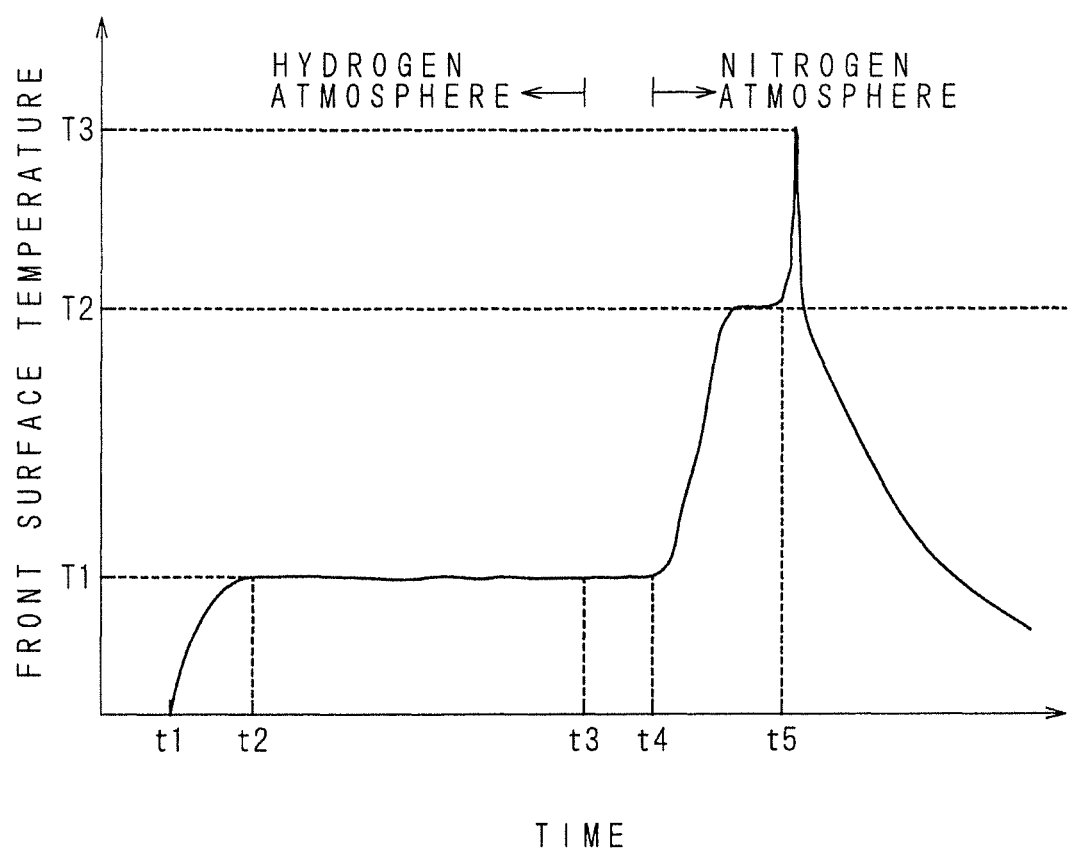
F I G . 1 2

HEAT TREATMENT METHOD FOR DOPANT INTRODUCTION

BACKGROUND OF THE INVENTION

Field of the Invention

The present invention relates to a heat treatment method for dopant introduction which introduces a dopant into a semiconductor substrate.

Description of the Background Art

In the process of manufacturing a semiconductor device, the introduction of a dopant into monocrystalline silicon or germanium is an essential step. An n-type semiconductor or a p-type semiconductor is produced by the introduction of a dopant. The introduction of a dopant is typically achieved by an ion implantation method in which dopant atoms such as boron (B), arsenic (As) and phosphorus (P) are implanted into a semiconductor substrate of silicon and the like and then performing an annealing process on the semiconductor substrate to activate the dopant atoms. However, the ion implantation method has a problem that crystal defects are produced in single crystal silicon and so forth.

In recent years, an attempt has been made to improve device performance by changing a conventional planar device structure to a three-dimensional structure (for example, a FinFET). In such a three-dimensional structure, it is difficult for a conventionally dominant ion implantation method to implant a dopant into a required location in some cases. To solve the problem, a dopant introduction technique different from the ion implantation method has been proposed (for example, Japanese Patent Application Laid-Open No. 2007-201337). This dopant introduction technique includes the steps of depositing a thin film of an oxide doped with a dopant such as boron and phosphorus (a PSG film, a BSG film and the like) on a semiconductor substrate, and then performing an annealing process on the semiconductor substrate on which the thin film is deposited to diffuse the dopant atoms from the thin film into the semiconductor.

However, a native oxide film is inevitably formed although it is extremely thin between a thin film containing the dopant and the semiconductor substrate, the native oxide film presenting as a barrier hinders diffusion of dopant atoms from the thin film to the semiconductor substrate. Although, the dopant atoms can be caused to pass the native oxide film and be diffused to the semiconductor substrate by applying a large amount of heat during annealing, however, the dopant atoms are diffused deeply when the large amount of heat is applied. As a result, the junction is deeply formed excessively, therefore, the low-resistance and extremely shallow junction cannot be obtained.

Prior to deposition of the thin film containing the dopant, the native oxide film is typically removed from the front surface of the semiconductor substrate by performing cleaning treatment with hydrofluoric acid (HF). Nevertheless, strictly speaking, the native oxide film starts to re-grow immediately after the completion of the removal processing, therefore, at the point when the thin film containing the dopant is deposited, the native oxide film is inevitably present on the front surface of the semiconductor substrate. Also, in the case of the FinFET having aforementioned three-dimensional structure, cleaning treatment with hydrofluoric acid per se is difficult to perform because the fin width becomes thinner by corrosion caused by hydrofluoric acid treatment, and the production of the device having an exact size as designed is hindered.

SUMMARY OF THE INVENTION

The present invention relates to a heat treatment method for dopant introduction.

According to one aspect of the present invention, the heat treatment method comprises the steps of (a) heating the semiconductor substrate on which a thin film containing the dopant is deposited to a first temperature under an atmosphere containing hydrogen, and (b) heating the semiconductor substrate to a second temperature higher than the first temperature for less than one second in an atmosphere of a gas different from hydrogen.

The dopant contained in the thin film is accumulated once at the interface between the semiconductor substrate and the native oxide film and then the dopant can be diffused in a shallow manner, and the dopant can be introduced in a shallow manner even if the semiconductor substrate is formed with the native oxide film.

It is therefore an object of the invention to introduce a dopant in a shallow manner even if a semiconductor substrate is formed with the native oxide film.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a sectional view of the susceptor;

FIG. 5 is a plan view of a transfer mechanism;

FIG. 7 is a plan view showing an arrangement of halogen lamps;

FIG. 10 is a schematic diagram showing how the dopant diffuses into the semiconductor wafer;

FIG. 11 is a schematic diagram showing a cross-section structure of the semiconductor wafer on which a diffusion layer containing the dopant is formed; and FIG. 12 is a graph showing changes of the front surface temperature of the semiconductor wafer.

DESCRIPTION OF THE PREFERRED EMBODIMENTS

Preferred embodiments according to the present invention will now be described in detail with reference to the drawings.

Figure 1:
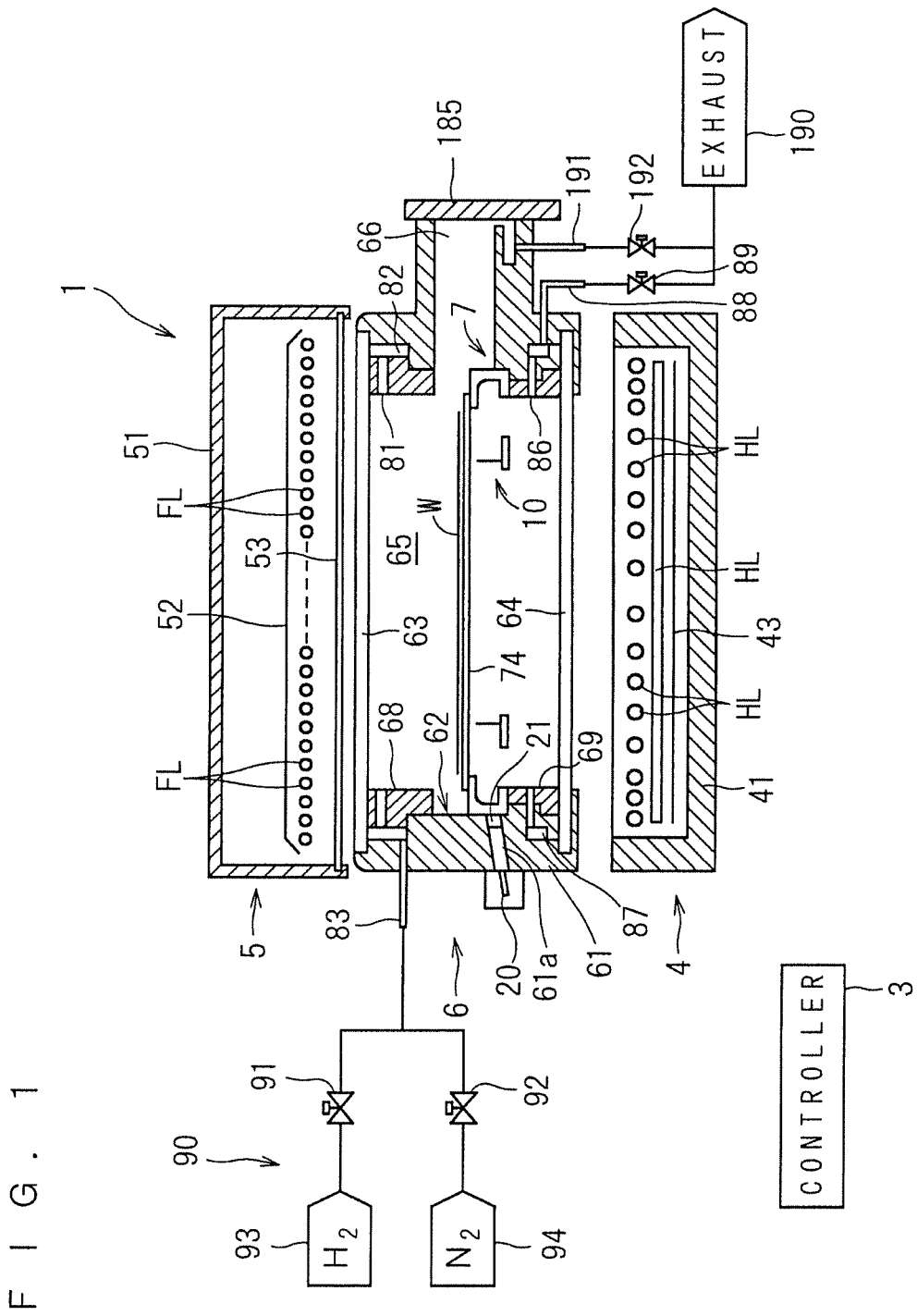
FIG. 1 is a longitudinal sectional view showing a configuration of a heat treatment apparatus used when a heat treatment method according to the present invention is performed.

First, a heat treatment apparatus for performing a heat treatment method according to the present invention will be described. FIG. 1 is a longitudinal sectional view showing a configuration of a heat treatment apparatus 1 used when a heat treatment method according to the present invention is performed. The heat treatment apparatus 1 of FIG. 1 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm and 450 mm. It should be noted that the dimensions of components and the number of components are shown in exaggeration or in simplified form, as appropriate, in FIG. 1 and the subsequent figures for the sake of easier understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 includes a gas supplier 90 that supplies treatment gas into a chamber 6. The heat treatment apparatus 1 includes, in the chamber 6, a holder 7 for holding the semiconductor wafer W in a horizontal attitude and a transfer mechanism 10 for transferring the semiconductor wafer W between the holder 7 and the outside of the apparatus. The heat treatment apparatus 1 further includes a controller 3 for controlling operating mechanisms provided in the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits flashes of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

Further, the chamber side portion 61 has a through hole 61a bored therein. At the location where the through hole 61a of an outer wall surface of the chamber 61, a radiation thermometer 20 is mounted. The through hole 61a is a hole having a cylindrical shape for guiding infrared radiation emitted from the lower surface of the semiconductor wafer W held by a susceptor 74 described later to the radiation thermometer 20. The through hole 61a is inclined with respect to the horizontal direction so that the axis in the penetrating direction intersects with the main surface of the semiconductor wafer W held by the susceptor 74. A transparent window 21 made of a barium fluoride material that allows infrared radiation in a wavelength region measurable by the radiation thermometer 20 to pass therethrough is attached to an end portion of the through hole 61a facing the heat treatment space 65. The radiation thermometer 20 receives the infrared radiation emitted from the lower surface of the semiconductor wafer W via the transparent window 21 and measures the temperature of the semiconductor wafer W from the intensity of the infrared radiation.

At least one gas supply opening 81 for supplying a treatment gas therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a supply pipe 83 of the gas supplier 90 through a buffer space 82 provided in the form of an annular ring inside the side wall of the chamber 6. The supply pipe 83 branches into two branches, one of which is connected to a hydrogen supply source 93 and the other thereof to a nitrogen supply source 94. A valve 91 is provided in a pipe branched from the supply pipe 83 and connected to the hydrogen supply source 93, and a valve 92 is provided in a pipe connected to the nitrogen supply source 94. When the valve 91 is opened, hydrogen gas ($H_2$) is delivered from the hydrogen supply source 93 to the supply pipe 83. Meanwhile, when the valve 92 is opened, nitrogen gas ($N_2$) is delivered from the nitrogen supply source 94 to the supply pipe 83. When both the valve 91 and the valve 92 are opened, a mixed gas of hydrogen and nitrogen is fed to the supply pipe 83. The gas supplier 90 of the heat treatment apparatus 1 includes the hydrogen supply source 93, the nitrogen supply source 94, the valve 91, the valve 92, and the supply pipe 83. The treatment gas fed from the supply pipe 83 flows into the buffer space 82 and flows in a spreading manner within the buffer space 82 which is lower in fluid resistance than the gas supply opening 81, and is supplied through the gas supply opening 81 into the heat treatment space 65. The supply flow rates of each of hydrogen and nitrogen can be adjusted by flow regulating valves or the like (not shown) provided in the branched pipes or the like.

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas supply pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

Figure 2:
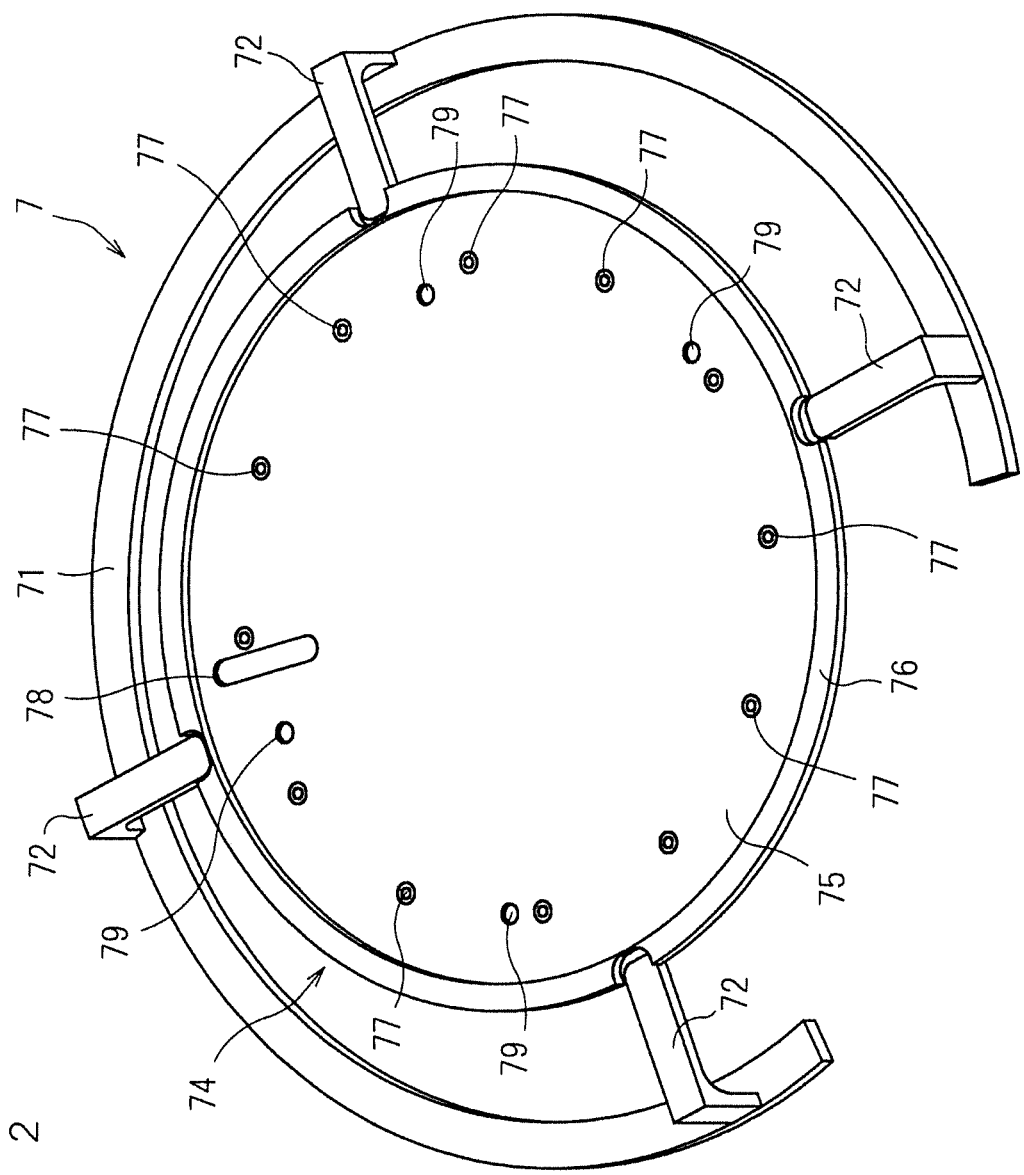
FIG. 2 is a perspective view showing the entire external appearance of a holder.

FIG. 2 is a perspective view showing the entire external appearance of the holder 7. The holder 7 includes a base ring 71, coupling portions 72, and a susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by the wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding.

Figure 3:
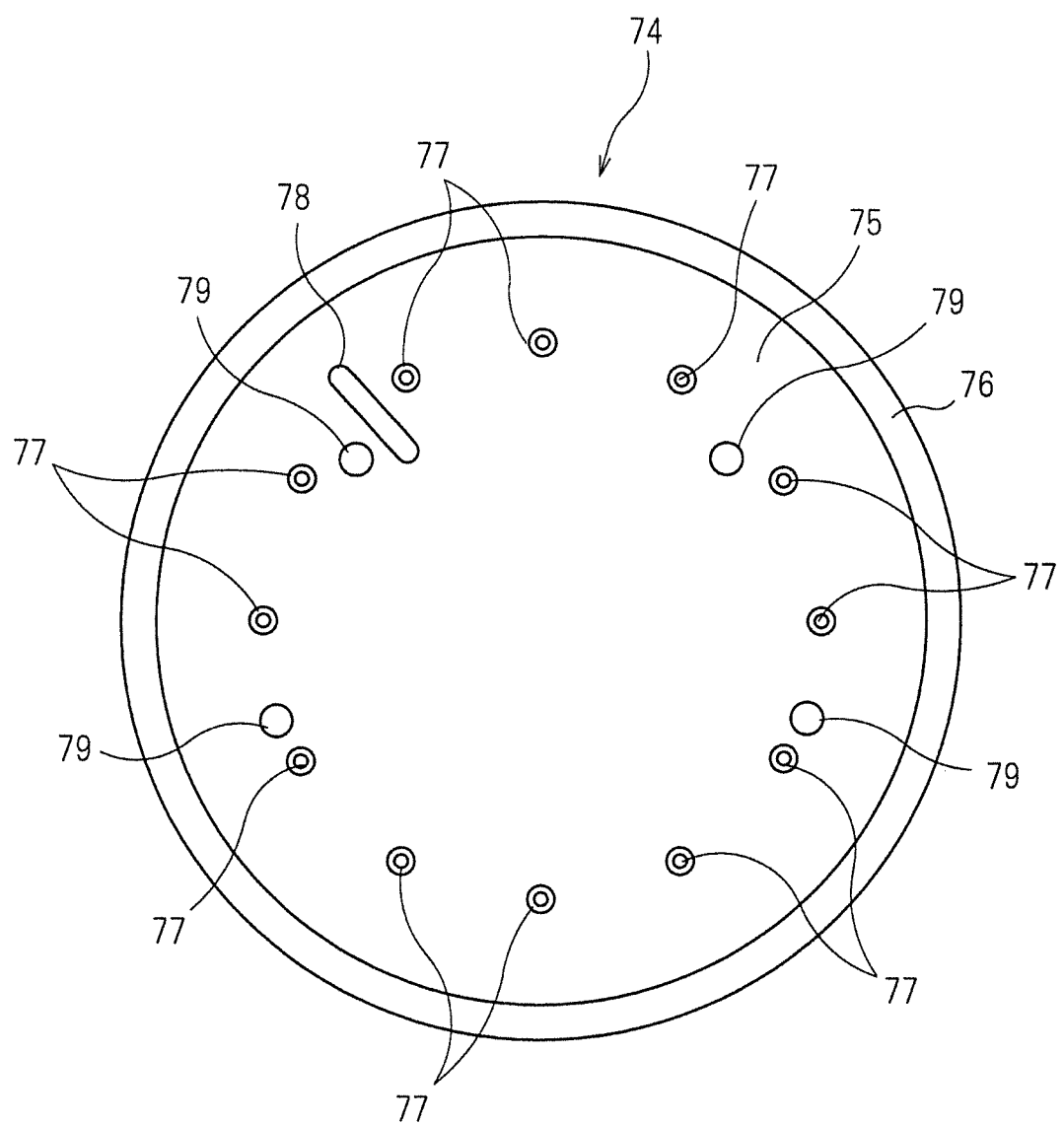
FIG. 3 is a plan view of a susceptor.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

A guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the holding plate 75 coincides with a vertical direction). In other words, the holding surface 75a of the holding plate 75 becomes a horizontal surface.

A semiconductor wafer W transported into the chamber 6 is placed and held in a horizontal attitude on the susceptor 74 of the holder 7 mounted to the chamber 6 At this time, the semiconductor wafer W is supported by the 12 substrate support pins 77 provided upright on the holding plate 75, and is held by the susceptor 74. More strictly speaking, the twelve substrate support pins 77 have respective upper end portions coming in contact with the lower surface of the semiconductor wafer W to support the semiconductor wafer W. The semiconductor wafer W is supported in a horizontal attitude by the twelve substrate support pins 77 because the twelve substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is provided in the holding plate 75 of the susceptor 74 so as to extend vertically through the holding plate 75 of the susceptor 74. The opening 78 is provided for a radiation thermometer 20 to receive radiation (infrared radiation) emitted from the lower surface of the semiconductor wafer W. Specifically, the radiation thermometer 20 receives the radiation emitted from the lower surface of the semiconductor wafer W through the opening 78 and the transparent window 21 attached to the through hole 61*a*, and measures the temperature of the semiconductor wafer W. Further, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

Figure 6:
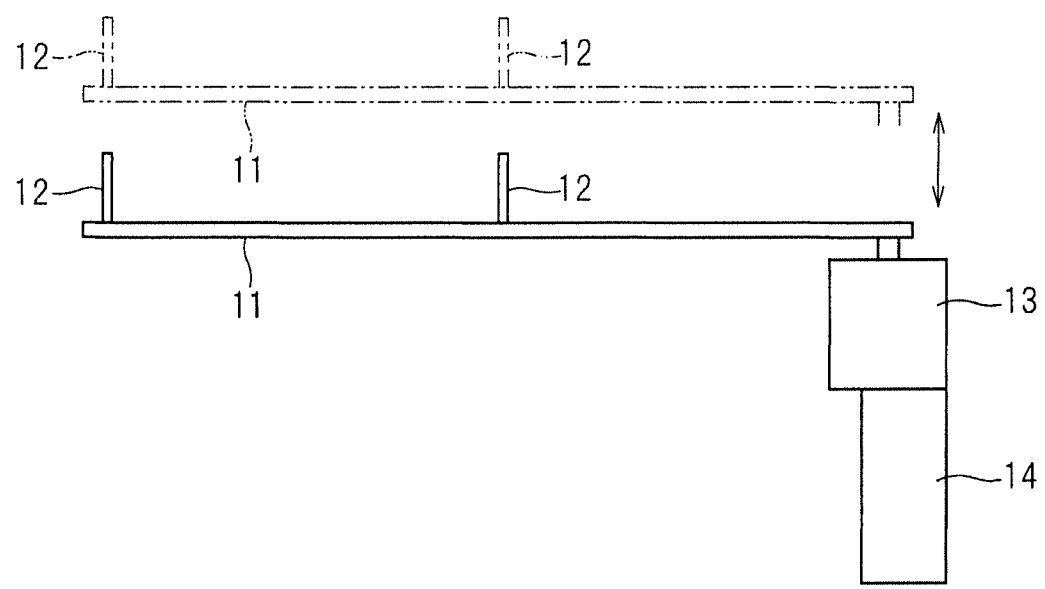
FIG. 6 is a side view of the transfer mechanism.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Returning again to FIG. 1, the flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz.

The flash heating part 5 is provided over the chamber 6, whereby the lamp light radiation window 53 and the upper chamber window 63 are opposite to each other. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane. The region where a plurality of flash lamps FL are arranged is larger than the size of the semiconductor wafer W as seen in plan view.

The xenon flash lamps FL includes a cylindrical glass tube (discharge tube) containing xenon gas sealed therein and having positive and negative electrodes connected to the capacitor provided on opposite ends thereof, and a trigger electrode attached to the outer peripheral surface of the glass tube. No electricity will flow through the glass tube in a normal state even if electrical charge is stored in the capacitor, because the xenon gas is electrically insulative. However, when the trigger electrode is applied with a high voltage to produce an electrical breakdown, electricity stored in the capacitor momentarily flows through the glass tube, so that xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure 41 incorporating the multiple (in the present preferred embodiment, 40) halogen lamps HL. The halogen heating part 4 directs light from under the chamber 6 through the lower chamber window 64 toward the heat treatment space 65 to heat the semiconductor wafer W by means of the halogen lamps HL.

FIG. 7 is a plan view showing an arrangement of the multiple halogen lamps HL. The 40 halogen lamps HL are arranged in two tiers, i.e. upper and lower tiers. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in the upper tier and the 20 halogen lamps HL in the lower tier are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. Thus, the halogen lamps HL are continuous lighting lamps that emit light continuously for not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined processing program, whereby the processes in the heat treatment apparatus 1 proceed.

The heat treatment apparatus 1 further includes, in addition to the aforementioned components, various cooling structures to prevent an excessive temperature rise in the halogen heating part 4, the flash heating part 5 and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Figure 8:
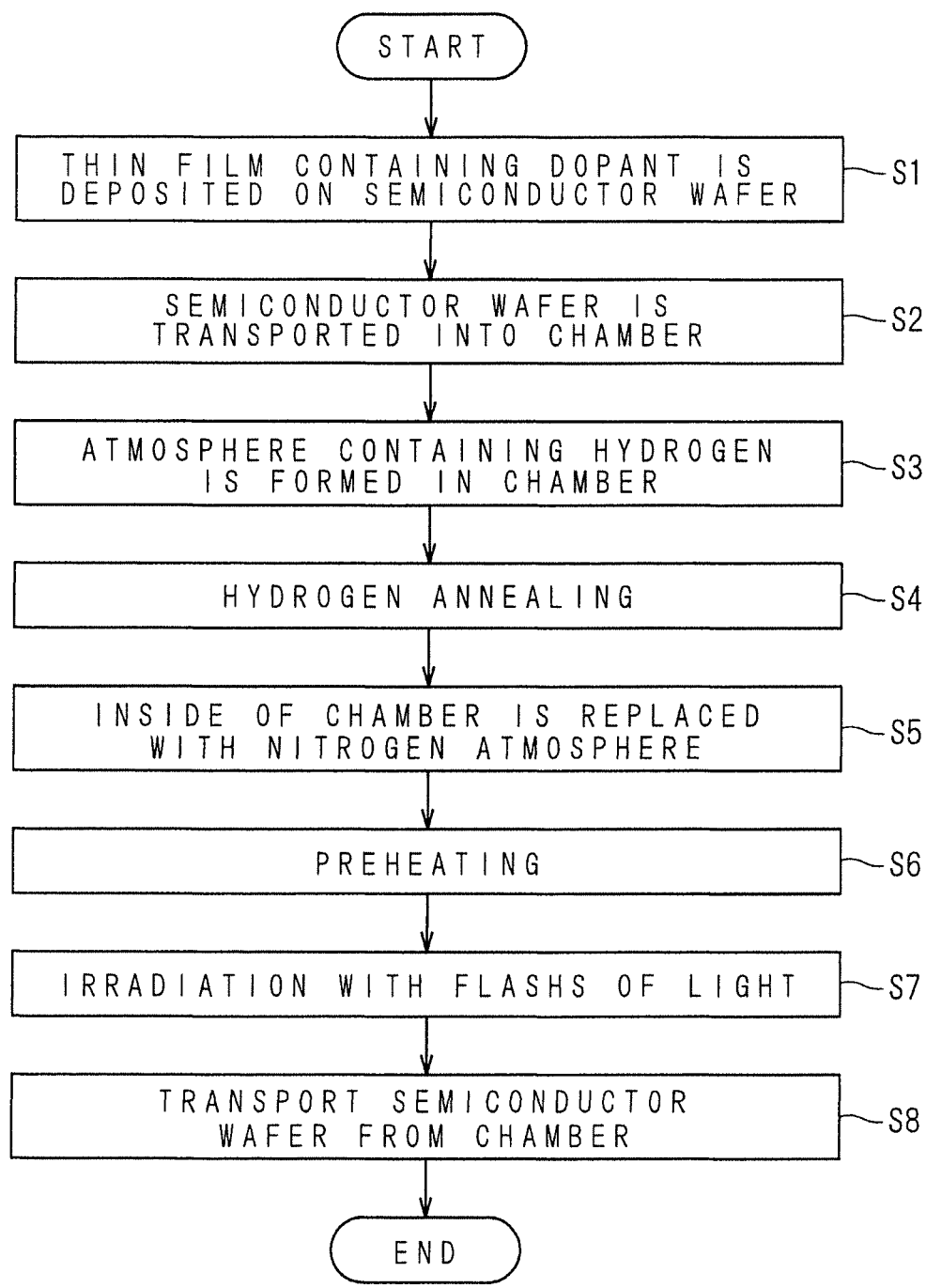
FIG. 8 is a flowchart showing a procedure of the heat treatment method according to the present invention.

Next, the heat treatment method according to the present invention will be described. FIG. 8 is a flowchart showing a procedure of the heat treatment method according to the present invention. The semiconductor substrate to be treated in the present preferred embodiment is a silicon (Si) semiconductor wafer W. First, a thin film containing a dopant is deposited on the front surface of the silicon semiconductor wafer W (step 51). The film deposition process in step Si is executed by a film deposition apparatus different from the above-described heat treatment apparatus 1. It should be noted that, prior to a deposition step in step Si, the surface of the semiconductor wafer W may be subjected to cleaning treatment with hydrofluoric acid or the like.

Figure 9:
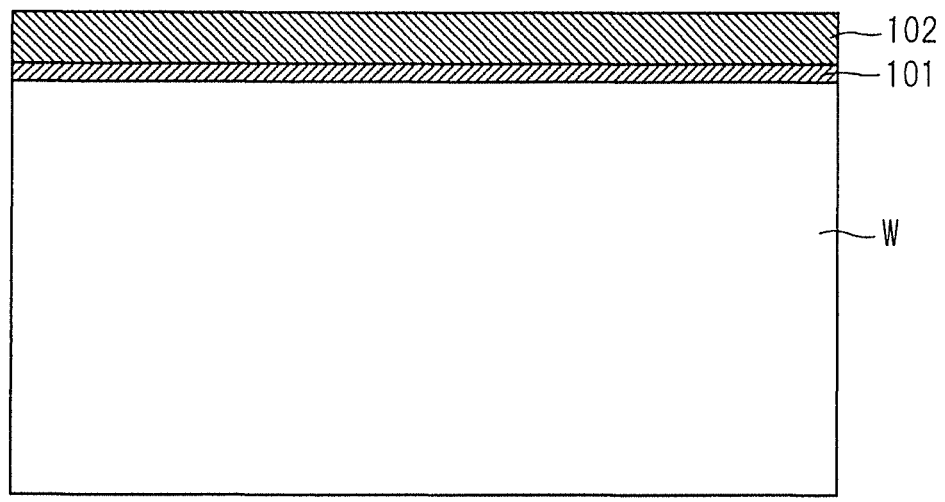
FIG. 9 is a schematic view of a cross-section structure of a semiconductor wafer on which a thin film containing a dopant is deposited.

FIG. 9 is a schematic view of a cross-section structure of the semiconductor wafer W on which the thin film containing the dopant is deposited. On the front surface of the silicon semiconductor wafer W, a native oxide film 101 of silicon dioxide ($SiO_2$) is formed. The native oxide film 101 is not intended to be formed, and even if it is removed by performing surface cleaning treatment of the semiconductor wafer W with hydrofluoric acid or the like, re-growth is immediately started after the removal treatment and is inevitably formed. Therefore, the thin film 102 containing the dopant is inevitably formed on the native oxide film 101. That is, the native oxide film 101 is interposed between the thin film 102 containing the dopant and the surface of the semiconductor wafer W.

In the present preferred embodiment, a film of silicon dioxide containing boron (B) (Boron Silicate Glass: BSG) is deposited as the thin film 102 containing the dopant. Such a BSG film can be deposited on the semiconductor wafer W by, for example, a spin coating method. The film thickness of the deposited thin film 102 is, for example, about 10 nm. The film thickness of the native oxide film 101 is, for example, about 1 nm.

Next, the semiconductor wafer W on which the thin film 102 containing the dopant is deposited is transported into the chamber 6 of the heat treatment apparatus 1 (step S2). The gate valve 185 is opened to open the transport opening 66. A transport robot outside the heat treatment apparatus 1 transports a semiconductor wafer W through the transport opening 66 into the heat treatment space 65 of the chamber 6. At this time, the amount of an atmosphere outside carried into the chamber 6 which is caused when the semiconductor wafer W is transported therein may be minimized by opening the valve 92 to supply the nitrogen gas therein and then let the nitrogen gas flow out from the transport opening 66.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66.

Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 in such an attitude that the front surface thereof where the thin film 102 containing the dopant is deposited is the upper surface. A predetermined distance is defined between the back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the transport opening 66 is closed by the gate valve 185 to cause the heat treatment space 65 to become an enclosed space, the atmosphere containing hydrogen is formed in the chamber 6 (step S3). Specifically, both the valve 91 and the valve 92 are opened, so that mixed gas of hydrogen and nitrogen is supplied through the gas supply opening 81 into the heat treatment space 65 as the treatment gas. Also, the valve 89 is opened, so that the gas within the chamber 6 is exhausted through the gas exhaust opening 86. This causes the treatment gas supplied from an upper portion of the heat treatment space 65 of the chamber 6 to flow downwardly and then to be exhausted from a lower portion of the heat treatment space 65, so that the atmosphere in the chamber 6 is replaced with an atmosphere containing hydrogen. The concentration of hydrogen in the atmosphere containing hydrogen formed in the chamber 6 is, for example, about 4 vol %. The gas within the chamber 6 is exhausted also through the transport opening 66 by opening the valve 192. Further, the exhaust mechanism not shown exhausts an atmosphere near the drivers of the transfer mechanism 10.

After the atmosphere containing hydrogen is formed in the chamber 6, the hydrogen annealing of the semiconductor wafer W is performed by the halogen lamps HL of the halogen heating part 4 (step S4). FIG. 12 is a graph showing changes in the temperature of the front surface of the semiconductor wafer W. After the atmosphere containing hydrogen is formed in the chamber 6, the 40 halogen lamps HL in the halogen heating part 4 turn on simultaneously at time t1 to start heating of the semiconductor wafer W. Halogen light emitted from the halogen lamps HL is transmitted through the lower chamber window 64 and the susceptor 74 both made of quartz, and impinges upon the back surface of the semiconductor wafer W. By receiving halogen light irradiation from the halogen lamps HL, the semiconductor wafer W is heated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W is measured with the radiation thermometer 20 when the halogen lamps HL perform the heating treatment. Specifically, the radiation thermometer 20 receives, through the transparent window 21, infrared radiation emitted from the lower surface of the semiconductor wafer W held by the susceptor 74 through the opening 78 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined annealing temperature T1 (first temperature) or not. In other words, the controller 3 performs feedback control of the output from the halogen lamps HL so that the temperature of the semiconductor wafer W is equal to the annealing temperature T1, based on the value measured with the radiation thermometer 20. The annealing temperature T1 of hydrogen annealing is 300° C. or more and 600° C. or less, more preferably 400° C. or more and 500° C. or less.

After the temperature of the semiconductor wafer W reaches the annealing temperature T1 at time t2, the controller 3 maintains the temperature of the semiconductor wafer W at the annealing temperature T1 for a predetermined hydrogen annealing time. Specifically, at the time t2 when the temperature of the semiconductor wafer W measured with the radiation thermometer 20 reaches the annealing temperature T1, the controller 3 controls the output from the halogen lamps HL to maintain the temperature of the semiconductor wafer W at approximately the annealing temperature T1 to a time t3. The hydrogen annealing time from time t2 to time t3 is 1 second or more and 1 hour or less, more preferably 1 minute or more and 30 minutes or less.

During the heating by the halogen lamp HL, the entire semiconductor wafer W is uniformly heated to the annealing temperature T1. In the stage of the heating using the halogen lamps HL, the semiconductor wafer W shows a tendency to be lower in temperature in a peripheral portion thereof where heat dissipation is liable to occur than in a central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W.

By heating the semiconductor wafer W in which the thin film 102 containing the dopant is deposited on the front surface thereof with the native oxide film 101 being interposed therebetween to the annealing temperature T1 in the hydrogen atmosphere, the diffusion rate of the dopant atoms in the silicon dioxide increases. As a result, it is considered that the dopant atoms contained in the thin film 102 diffuse through the native oxide film 101 and accumulate at a high concentration at the interface between the front surface of the semiconductor wafer W and the native oxide film 101.

If the annealing temperature T1 is 600° C. or less, there is no possibility that the dopant atoms contained in the thin film 102 diffuse over the native oxide film 101 to the front surface of the semiconductor wafer W. If the annealing temperature T1 is 300° C. or more, it is possible for the dopant atoms to diffuse through the native oxide film 101. For this reason, the annealing temperature T1 of hydrogen annealing is limited to 300° C. or more and 600° C. or less.

At time t3 at which a predetermined hydrogen annealing time has elapsed, the inside of the chamber 6 is replaced with a nitrogen atmosphere from a hydrogen atmosphere (step S5). Specifically, the valve 91 is closed and only the valve 92 is opened, therefore, the heat treatment space 95 is supplied with only nitrogen gas. Also, the valve 89 is continuously open, so that the gas within the chamber 6 is exhausted through the gas exhaust opening 86. As a result, the hydrogen concentration in the heat treatment space 65 decreases, and the inside of the chamber 6 is replaced with a nitrogen atmosphere at the time t4. It should be noted that, the inside of the chamber may be filled with the nitrogen atmosphere by temporarily reducing the pressure of the atmosphere in the chamber 6 to a pressure lower than atmospheric pressure by exhausting only without gas supply with both the valve 91 and the valve 92 being closed, and thereafter, opening only the valve 92. By temporarily reducing the pressure of the atmosphere in the chamber 6, the atmosphere therein can be replaced with the nitrogen atmosphere smoothly and swiftly.

At time t4 at which the inside of the chamber 6 is replaced with the nitrogen atmosphere, preheating (or assist-heating) of the semiconductor wafer W is started (step S6). In the preheating step, the controller 3 increases the output of the halogen lamps HL as compared with that during the hydrogen annealing, and increases the intensity of the halogen light irradiated to the back surface of the semiconductor wafer W. As a result, the temperature of the semiconductor wafer W further increases from the annealing temperature T1.

Similarly to hydrogen annealing, the controller 3 performs feedback control of the output from the halogen lamps HL during preheating so that the temperature of the semiconductor wafer W is equal to the preheating temperature T2, based on the value measured with the radiation thermometer 20. The annealing temperature T2 is higher than the annealing temperature T1 of hydrogen annealing, and is 600° C. or more and 1100° C. or less. After the temperature of the semiconductor wafer W reaches the preheating temperature T2, the controller 3 controls the output from the halogen lamps HL to maintain the temperature of the semiconductor wafer W at the preheating temperature T2 for a short time.

The flash lamps FL of the flash heating part 5 irradiate the front surface of the semiconductor wafer W held with the susceptor 74 with flashes of light at a time t5 when a predetermined time has elapsed after the temperature of the semiconductor wafer W reaches the preheating temperature T2 (step S7). At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such flashes of light achieves the flash heating of the semiconductor wafer W.

The flash heating, which is achieved by the emission of a flash of light from the flash lamps FL, is capable of increasing the front surface temperature of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. And, after the temperature of the front surface of the semiconductor wafer W including the thin film 102 and the native oxide film 101 is momentarily increased to a peak temperature T3 (second temperature) by the flash irradiation from the flash lamps FL, the temperature thereof decreases rapidly. The peak temperature T3 is higher than the preheating temperature T2 and lower than the melting point of the silicon semiconductor wafer W.

By heating the semiconductor wafer W to the preheating temperature T2 under the nitrogen atmosphere followed by flash heating, as shown in FIG. 10, the dopant atoms accumulated at the interface between the front surface of the semiconductor wafer W and the native oxide film 101 are diffused to the front surface of the semiconductor wafer W and the diffused dopant atoms are activated. As a result, the diffusion layer containing the dopant is formed on the front surface of the semiconductor wafer W. FIG. 11 is a schematic view of a structure of a cross-section structure of the semiconductor wafer W on which the diffusion layer 103 containing the dopant is formed.

The flash light irradiation time during flash heating is an extremely short time of 100 milliseconds or less. Therefore, the time during which the front surface temperature of the semiconductor wafer W is at the peak temperature T3 is less than 1 second. That is, flash heating is millisecond annealing in which the front surface of the semiconductor wafer W is heated to the peak temperature T3 for less than one second. The time period for heating the front surface of the semiconductor wafer W to the peak temperature T3 is a short time period of less than one second, therefore, dopant atoms are suppressed from diffusing deeply from the front surface of the semiconductor wafer W. Moreover, millisecond annealing is performed under an atmosphere of gas different from hydrogen, therefore, dopant atoms are further suppressed from diffusing deeply from the front surface of the semiconductor wafer W. Also, the temperature of the front surface of the semiconductor wafer W is increased to a relatively high temperature of the peak temperature T3, the increased activation rate of the diffused dopant atoms and the reduction in the resistance of the diffusion layer 103 are ensured. That is, low-resistance and extremely shallow junction can be obtained by flash heating in which the front surface of the semiconductor wafer W is heated to the peak temperature T3 for less than one second.

The turning off of the halogen lamps HL after the completion of the flash heating treatment causes the temperature of the semiconductor wafer W to decrease rapidly. The radiation thermometer 20 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement with the radiation thermometer 20. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside. Thus, the heat treatment apparatus 1 completes the heating treatment of the semiconductor wafer W (step S8).

In the preferred embodiment, hydrogen annealing is performed on the semiconductor wafer W on which the thin film 102 containing the dopant is deposited, and then the flash heating treatment of the semiconductor wafer W is performed. The native oxide film 101 is inevitably present between the thin film 102 containing the dopant and the front surface of the semiconductor wafer W. Therefore, if simply the preheating and the flash heating are performed on the semiconductor wafer W without hydrogen annealing, the dopant atoms contained in the thin film 102 cannot diffuse over the native oxide film 101 to the front surface of the semiconductor wafer W, because the native oxide film 101 serves as a barrier. On the other hand, if the semiconductor wafer W is heated to a high temperature of about the peak temperature T3 for several seconds or more, the dopant atoms contained in the thin film 102 pass through the native oxide film 101 and diffuse to the front surface of the semiconductor wafer. However, as described above, when a large amount of heat is applied, the dopant atoms diffuse excessively deeply from the front surface of the semiconductor wafer W.

Accordingly, in the present preferred embodiment, first, hydrogen annealing is performed to heat the semiconductor wafer W on which the thin film 102 containing the dopant is formed to the annealing temperature T1 in an atmosphere containing hydrogen. By performing hydrogen annealing, the dopant atoms contained in the thin film 102 diffuse relatively easily in the native oxide film 101 and accumulate at the interface between the front surface of the semiconductor wafer W and the native oxide film 101. In addition, by performing hydrogen annealing, defects in the thin film 102 containing the dopant are hydrogen-terminated; therefore, out-diffusion of the dopant is prevented.

And, then the flash heating treatment is performed to heat the front surface of the semiconductor wafer W to the peak temperature T3 for less than 1 second in a nitrogen atmosphere. As a result, the dopant atoms accumulated at the interface between the front surface of the semiconductor wafer W and the native oxide film 101 are diffused and activated in a shallow manner from the front surface of the semiconductor wafer W, thus, the low-resistance and extremely shallow junction is obtained. That is, the dopant atoms contained in the thin film 102 are accumulated once at the interface between the front surface of the semiconductor wafer W and the native oxide film 101 by performing hydrogen annealing, and then the flash heating is performed, thereby, the dopant can be introduced in a shallow manner even if the semiconductor wafer W is formed with the native oxide film 101.

While the preferred embodiment according to the present invention has been described herein above, various modifications of the present invention in addition to those described above may be made without departing from the scope and spirit of the invention. For example, in the aforementioned preferred embodiment, a film of silicon dioxide containing boron is deposited as the thin film 102 including a dopant, however, a silicon dioxide film containing phosphorus (P) (Phosphorus Silicate Glass: PSG) may be deposited in place thereof.

Further, the thin film 102 containing a dopant is not limited to films of BSG and PSG, and may include films formed by Molecular mono layer doping (MLD) and Atomic layer doping (ALD). Examples of the dopant contained in the thin film 102 include boron, phosphorus, arsenic (As), and the like.

Also, in the aforementioned preferred embodiment, hydrogen annealing is performed, and then the flash heating treatment of the semiconductor ware W is performed, however it is not limited thereto, millisecond annealing in which the front surface of the semiconductor wafer W is heated to the peak temperature T3 for less than one second after hydrogen annealing may be applied. An example of millisecond annealing other than flash heating treatment is laser annealing.

Further, the atmosphere in which the flash heating treatment is performed after the hydrogen annealing is not limited to the nitrogen atmosphere, and may be other gas atmosphere (other than nitrogen) other than hydrogen. For example, flash heating treatment performed after hydrogen annealing may be performed under an atmosphere of activated gas such as ammonia ($NH_3$). Alternatively, flash heating treatment performed after hydrogen annealing may be performed under a reduced-pressure atmosphere in which the pressure of the atmosphere in the chamber 6 is reduced to a pressure lower than atmospheric pressure, preferably, under a vacuum atmosphere. In the reduced-pressure atmosphere (or the vacuum atmosphere), the inside of the chamber 6 has an extremely low oxygen concentration, therefore, the activation rate of the dopant atoms can be further increased.

Also, in the aforementioned preferred embodiment, both the hydrogen annealing and the flash heating treatment are performed in the chamber 6 of the heat treatment apparatus 1, hydrogen annealing and flash heating treatment may be performed in separate apparatuses. Specifically, a dedicated annealing apparatus for performing hydrogen annealing may be provided separately from the heat treatment apparatus 1 performing flash heating treatment. As such an annealing apparatus, for example, an atmosphere furnace in which the object is heated in a hydrogen atmosphere can be used.

Also, preferably, a plurality of annealing apparatuses (or an annealing apparatus that can process in multiple stages) are provided for one heat treatment apparatus 1. In the case where the hydrogen annealing time is remarkably long as compared with the flash heating time, by providing a plurality of annealing apparatuses for one heat treatment apparatus 1, lowering of the throughput can be suppressed.

Further, the hydrogen concentration in the chamber 6 at the time of hydrogen annealing is not limited to 4 vol %, and may be 4 vol % or more and may be 4 vol % or less.

Further, the semiconductor substrate to be treated is not limited to the silicon semiconductor wafer W but may be a semiconductor wafer such as germanium (Ge), silicon germanium (SiGe), silicon carbide (SiC), gallium nitride (GaN).

Although the 30 flash lamps FL are provided in the flash heating part 5 according to the aforementioned preferred embodiments, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

In the aforementioned preferred embodiment, the filament-type halogen lamps HL are used as continuous lighting lamps that emit light continuously for not less than one second to perform hydrogen annealing and preheating of the semiconductor wafer W. The present invention, however, is not limited to this. In place of the halogen lamps HL, discharge type arc lamps (for example, xenon arc lamps) may be used as the continuous lighting lamps and hydrogen annealing and preheating may be performed therewith.

While the invention has been described in detail, the foregoing description is in all aspects illustrative and not restrictive. It is understood that numerous other modifications and variations can be devised without departing from the scope of the invention.

What is claimed is:

1. A heat treatment method for introducing a dopant into a semiconductor substrate, said method comprising the steps of:

(a) heating the semiconductor substrate on which a thin film containing the dopant is deposited to a first temperature under an atmosphere containing hydrogen; and (b) heating said semiconductor substrate to a second temperature higher than said first temperature for less than one second in an atmosphere of a gas different from hydrogen.

2. The heat treatment method according to claim 1, further comprising the step of (c) heating said semiconductor substrate to a temperature higher than said first temperature and lower than said second temperature between said step (a) and the said step (b).

3. The heat treatment method according to claim 1, wherein said first temperature is 300° C. or more and 600° C. or less.

4. The heat treatment method according to claim 1, wherein, in said step (b), said semiconductor substrate is heated under a nitrogen atmosphere.

5. The heat treatment method according to claim 1, wherein, in said step (b), said semiconductor substrate is heated by irradiating said semiconductor substrate with a flash of light from a flash lamp.

6. The heat treatment method according to claim 1, wherein a film of silicon dioxide containing the dopant is deposited on said semiconductor substrate.

7. The heat treatment method according to claim 1, wherein a native oxide film is formed between the thin film containing said dopant and a front surface of said semiconductor substrate.

* * * * *